United States Patent [19]

Bakhmutsky et al.

[11] Patent Number: 5,657,016
[45] Date of Patent: Aug. 12, 1997

[54] VARIABLE LENGTH DECODER WITH ONE OF N LENGTH INDICATOR

[75] Inventors: Michael Bakhmutsky, Spring Valley; Viktor L. Gornstein, New York; Howard B. Pein, Briarcliff Manor, all of N.Y.

[73] Assignee: Philips Electronics North America Corporation, New York, N.Y.

[21] Appl. No.: 583,149

[22] Filed: Dec. 28, 1995

[51] Int. Cl.$^6$ ............................................. H03M 7/40
[52] U.S. Cl. ............................................. 341/67; 341/65
[58] Field of Search ............................... 341/67, 65, 106

[56] References Cited

U.S. PATENT DOCUMENTS

| | | | |
|---|---|---|---|
| 3,568,148 | 3/1971 | Clark | 340/146.1 |
| 5,173,695 | 12/1992 | Sun et al. | 341/67 |
| 5,220,325 | 6/1993 | Ackland et al. | 341/67 |
| 5,233,348 | 8/1993 | Pollmann et al. | 341/67 |
| 5,243,628 | 9/1993 | Moritoki et al. | 375/49 |
| 5,245,338 | 9/1993 | Sun | 341/67 |
| 5,253,053 | 10/1993 | Chu et al. | 358/133 |
| 5,325,092 | 6/1994 | Allen et al. | 341/65 |
| 5,363,097 | 11/1994 | Jan | 341/67 |
| 5,561,690 | 10/1996 | Park | 375/340 |

FOREIGN PATENT DOCUMENTS

| | | |
|---|---|---|
| 0614317 | 9/1994 | European Pat. Off. . |
| 0631440 | 12/1994 | European Pat. Off. . |

*Primary Examiner*—Jeffrey A. Gaffin
*Assistant Examiner*—Peguy JeanPierre
*Attorney, Agent, or Firm*—Laurie E. Gathman

[57] ABSTRACT

A high speed variable length decoder with an enhanced architecture for minimizing the propagation delays within the processing paths of the variable length decoder. The variable length decoder includes an input circuit for receiving code words and outputting a sequence of bits on a corresponding sequence of parallel lines that define a decoding window. The input circuit preferably includes a "one-hot" bit stream barrel shifter matrix having a shift input. The decoding window is input to a "one-hot" word length decoder that provides a numbered sequence of output lines. The "one-hot" word length output of the "one-hot" word length decoder is applied to an input of a "one-hot" ring barrel shifter matrix, and an input of a "one-hot" overflow barrel shifter matrix. The output of the "one-hot" ring barrel shifter matrix is a "one-hot" word pointer which shifts the decoding window to the next code word to be decoded. This enhanced "one-hot" architecture greatly accelerates the word length computation loop of the variable length decoder of the present invention relative to the presently available variable length decoders having a conventional architecture. The decoding window is also connected to the input of a code word value decoder circuit. The code word value decoder circuit determines the values of code words and provides the decoded values at the output of the variable length decoder. A control circuit controls the operation of the value decoding circuit, the word length computation loop, and the input circuit, in accordance with a prescribed decoding protocol, e.g., an MPEG protocol.

19 Claims, 4 Drawing Sheets

VARIABLE LENGTH DECODER WITH ONE OF N LENGTH INDICATOR

BACKGROUND OF THE INVENTION

The present invention relates generally to variable length decoders used in data transmission systems, and more particularly, to a variable length decoder for decoding digital video data for high definition television (HDTV).

In digital video data transmission systems, video data is encoded prior to being transmitted to a receiver, which decodes the encoded digital video data. The decoded digital video data is then output to a subsequent signal processing stage. To increase the data throughput and memory efficiency of such systems, statistical compression algorithms are used to compress and encode the digital video data. One such compression algorithm is the Huffman coding algorithm. Compressing the data typically results in data streams segmented into variable length code words rather than fixed length code words. Variable length decoders decode the variable length code words comprising the compressed data stream.

There are several presently available methods for decoding a sequence of variable length code words. The most prevalent methods are the tree searching algorithm and the table look-up technique.

The tree searching algorithm uses a bit-by-bit search through a code tree to find the end and value of each code word in the input bit stream. The coding tree includes leaves of known code words. The decoding process begins at the root of the coding tree and continues bit-by-bit to different branches of the coding tree, depending upon the decoded value of each successive bit in the bit stream. Eventually a leaf is reached and the end of the code word is detected. The code word is then segmented from the rest of the bit stream and the value of the detected code word is looked up and output from the variable length decoder. Decoding a bit stream using the tree searching algorithm is too slow for many high speed applications, since the decoding operation is performed at the bit rate rather than at the symbol rate. In this connection, decoding a bit stream at the bit rate does not satisfy the peak symbol rate requirements of an HDTV decoder.

To increase the data throughput of a variable length decoder, a table look-up decoder was developed, such as the one disclosed in U.S. Pat. No. 5,173,695, issued to Sun et al., the disclosure of which is herein incorporated by reference. The input of the table look-up decoder disclosed in the above-referenced patent is connected to the output of a rate buffer which receives a variable-word-length encoded bit stream at its input and outputs in parallel sequences of bits equal in length to the maximum length code word in the bit stream. These sequences are read into cascaded latches. The cascaded sequences in both latches are input to a barrel shifter which provides from its multi-bit input, a sliding decoding window to a table-lookup decoder. A control signal directly shifts the position of the decoding window of the barrel shifter as each code word is detected.

To detect each code word, the initial bits in the decoding window are compared with code word entries in the table-lookup decoder. When a code word is detected, the corresponding code word length is added to the value of an accumulator with previously accumulated code word lengths to produce the control signal which directly shifts the decoding window by the number of bits in the just decoded word. When all of the bits in the first latch have been decoded, the next bit sequence in the buffer is input to the second latch while the previous bit sequence in the second latch is transferred to the first latch. The decoding window is then shifted to the beginning of the next code word in the undecoded sequence. The shifting of the decoding window and the decoding of the code word can be done in one clock cycle. As a result, the table look-up decoder is capable of decoding one code word per clock cycle regardless of its bit length, thereby dramatically increasing the data throughput of the decoder relative to the previously available tree searching algorithm decoder.

In consumer HDTV applications, however, where the peak symbol rate is about 100 million code words per second, decoding the whole picture at the symbol rate with a single variable length decoder becomes impractical. In HDTV systems, the variable length decoder (VLD) is used to extract an entire picture from a rate buffer within the picture display time. The VLD must decode words in the data stream at the peak symbol rate (PSR), which depends upon the display resolution and the display time. For HDTV systems which use the MPEG ("Moving Pictures Expert Group") protocol, a VLD throughput of 100 million or more code words per second is required. In addition to the technical problems associated with implementing the VLD itself with such throughput, the high-speed VLD interface with the large capacity rate buffer is quite expensive with the currently available memory technology. The problem becomes more severe if price is an issue, since faster and more expensive memory devices such as static random access memories (SRAMs) and synchronous dynamic random access memories (SDRAMs) must be used, rather than slower and cheaper memory devices such as asynchronous DRAMs. Of course, the price of the memory is a particularly important consideration for a consumer product, such as an HDTV set.

In current implementations, HDTV systems are normally partitioned into multiple processing paths, using multiple VLDs to decode different portions of the picture in parallel. In such implementations, the VLD is one of the major bottlenecks. Because each partition of the picture may contain almost all of the picture information, multiple dedicated ping-pong buffers are required between all of the VLDs and the rate buffer, thereby dramatically increasing the amount of bit stream memory required for the system. For example, a partitioned decoding system having eight parallel VLDs requires eight ping-pong buffers, each one of the ping-pong buffers being twice the size of the rate buffer, thereby increasing the amount of required buffer memory by a factor of sixteen over a system having a single VLD.

Based on the above and foregoing, it can be appreciated that there presently exists a need in the art for a variable length decoder which overcomes the above-discussed drawbacks and shortcomings of the presently available technology, and which can be used to implement a single VLD HDTV decoder, rather than a partitioned HDTV decoder. More particularly, there presently exists a need in the art for a variable length decoder having a data throughput which is adequate for processing digital video data.

The present invention fulfills this need in the art by providing a variable length decoder having a word length computation loop which is implemented in a one-hot architecture. The one-hot architecture of the word length computation loop of the variable length decoder of the present invention significantly reduces the propagation delay through the word length computation loop relative to the word length computation loop used in the conventional variable length decoders, such as the one disclosed in the above-referenced Sun et al. patent, and thereby greatly accelerates the word length computation loop, thus facilitating greater throughput. In this regard, the one-hot word length computation loop of the present invention eliminates the layers of logic gates required in the conventional word length computation loop, which includes a wide-barrel shifter, a conventional word length decoder with large Huffman look-up tables, and an adder-accumulator.

With the one-hot architecture of the word length computation loop of a preferred embodiment of the present invention, the wide-barrel shifter is replaced by a "one-hot" bit stream barrel shifter matrix, the conventional word length decoder is replaced by a "one-hot" word length decoder, and the adder is replaced by a "one-hot" ring barrel shifter matrix and "one-hot" overflow barrel shifter matrix. Alternatively, significant acceleration of the word length computation loop can be achieved even if conventional barrel shifters are used instead of the "one-hot" barrel shifter matrices.

SUMMARY OF THE INVENTION

The need in the art is addressed by the high speed variable length decoder of the present invention. More particularly, the variable length encoder of the present invention has an enhanced "one-hot" architecture which minimizes the propagation delay of the word length computation loop of the variable length decoder, and thus dramatically improves the throughput per clock cycle relative to presently available variable length decoders having a conventional architecture.

The variable length decoder includes an input circuit for receiving the input bit stream and outputting a sequence of bits over a corresponding sequence of numbered parallel output lines that define a decoding window. The input circuit preferably includes a "one-hot" bit stream barrel shifter matrix which has an input provided with a parallel sequence of available input bits, e.g., sixty-four available input bits. The decoding window is input to a "one-hot" word length decoder circuit which generates a "one-hot" word length signal at its output. The length of a given code word is represented by a distinct voltage state on the output line whose number corresponds to the length of the code word. In this regard, the "one-hot" word length signal has a bit width which is the same as that of the decoding window, e.g., thirty-two bits. Only one of the bits of the thirty-two bits is high at any given time, and hence, the name "one-hot".

The decoding window is shifted in accordance with a "one-hot" word pointer generated by a "one-hot" ring barrel shifter matrix in response to the "one-hot" word length signal, across the sequence of available input bits according to the length (or combined length) of the code word(s) decoded during a previous clock cycle, so that the start of a next code word to be processed during the current clock cycle begins at the left edge of the decoding window. The "one-hot" word pointer is a parallel sequence of bits applied over corresponding parallel lines to a shift input of the "one-hot" bit stream barrel shifter matrix. The bit-width of the "one-hot" word pointer is the same as the bit-width of the decoding window, and only one of the bits of the "one-hot" word pointer is high at any given time, the high bit pointing to the available input bit which constitutes the first bit of the next code word to be decoded.

The decoding window is also connected to the input of a code word value decoder circuit. The code word value decoder circuit decodes the values of code words and provides the decoded values at the output of the variable length decoder.

A control circuit controls the operation of the input circuit, the word length computation loop, and the code word value decoder circuit in accordance with a prescribed decoding protocol, e.g., an MPEG protocol. In the specific embodiment disclosed herein, the control circuit includes a state machine and associated logic circuitry.

BRIEF DESCRIPTION OF THE DRAWINGS

The above and other objects, features, and advantages of the present invention will become apparent from the following detailed description taken in conjunction with the accompanying drawings, in which.

DETAILED DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
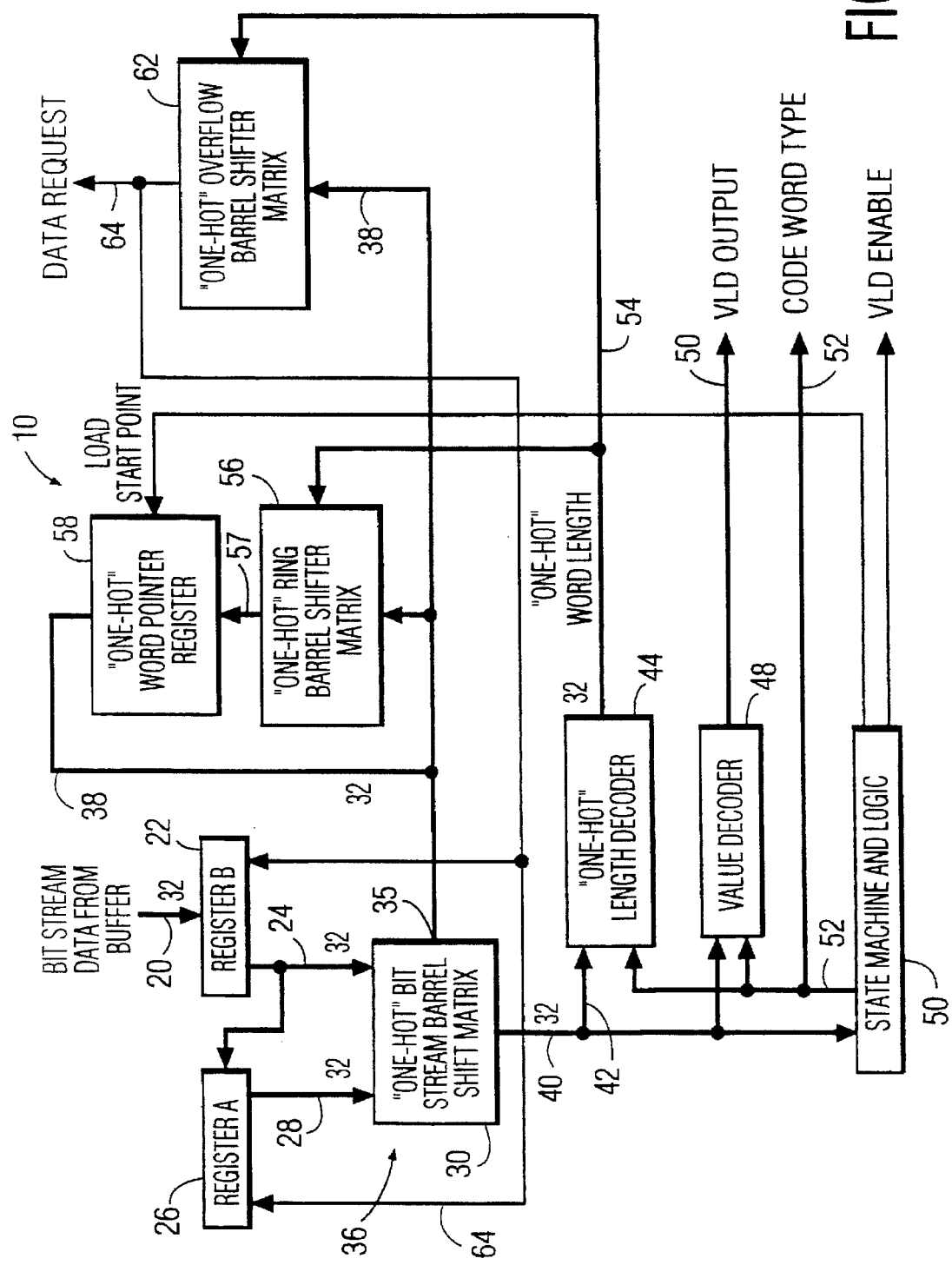
FIG. 1 is block diagram of a specific embodiment of the variable length decoder of the present invention.

FIG. 1 is a diagram of a specific embodiment of the variable length decoder 10 of the present invention. An input bit stream 20 contains code words to be decoded. In the present specific embodiment, the input bit stream 20 is an MPEG digital video data stream. A first register 22 is connected to a "one-hot" bit stream barrel shifter matrix 30 via thirty-two (32) parallel input bit lines 24, each line corresponding to a bit in the first register 22. A second register 26 is connected to the one-hot bit stream barrel shifter matrix 30 via thirty-two (32) parallel input bit lines 28, each line corresponding to a bit in the second register 26. Thus, a total of sixty-four (64) parallel input bit lines 24, 28 are connected to the one-hot bit stream barrel shifter matrix 30, thereby providing a corresponding sequence of sixty-four (64) available input bits for the one-hot bit stream barrel shifter matrix 30. The one-hot bit stream barrel shifter matrix 30 has a shift input 35 and thirty-two (32) parallel output bit lines 40 which define a decoding window 40. Those skilled in the art will appreciate that other numbers of parallel input bit lines 24, 28 and parallel output bit lines 40 may be utilized without departing from the spirit and scope of the present invention. In the present specific embodiment, the number of parallel input bit lines 24, the number of parallel input bit lines 28, and the number of parallel output bit lines 40 are each chosen to be equal in number to the maximum number of bits in a code word (i.e., maximum code word length).

Initially, in response to a data request signal applied over the line 64, a sequence of thirty-two bits representing code words to be decoded is loaded into the first register 22 from the input bit stream 20. Once the first register 22 is loaded with bits, the contents of the first register 22 are transferred to the second register 26 over thirty-two (32) parallel bit lines 24, and the next sequence of thirty-two bits from the input bit stream 20 is loaded into the first register 22. Thus, a sequence of sixty-four input bits is available to the one-hot bit stream barrel shifter matrix 30. The thirty-two parallel output bit lines 40 are chosen from the sixty-four parallel input bit lines 24, 28 in a manner discussed below, to thereby provide the decoding window 40. The decoding window 40 is shifted from left to right across the sequence of available input bits in response to a "one-hot" word pointer applied over thirty-two parallel bit lines 38 to the shift input 35 of the one-hot bit stream barrel shifter matrix 30. The decoding window 40 is shifted by the one-hot word pointer across the sequence of available input bits according to the length (or combined length) of the code word(s) decoded during a previous clock cycle, so that the start of a next code word(s) to be processed during the current clock cycle begins at the left edge of the decoding window 40. Thus, the one-hot word pointer applied over the lines 38 marks or points the left edge of the decoding window 40.

The variable length decoder 10 further includes a control circuit 50, which in the present implementation, is comprised of a state machine and associated logic circuitry which controls the operation of the variable length decoder 10 in accordance with a prescribed decoding protocol, e.g., an MPEG protocol. In this connection, the control circuit 50 determines the types of code words to be decoded on the basis of current and previously decoded code words, and produces a code word type control signal which is applied over a line 52 to a one-hot length decoder 44 and a code word value decoder 48, and which is applied as a code word type stream on the line 52 as an output of the variable length decoder 10. The code word type control signal applied over the lines 52 selects the proper look-up table in the code word value decoder 48 and the one-hot length decoder 44 for decoding the value and length of a code word currently present in the decoding window 40, respectively.

The code word value decoder 48 outputs the decoded value of a code word in the decoding window 40 over an output line 50 of the variable length decoder 10.

The one-hot length decoder 44 outputs a thirty-two (32) bit wide one-hot word length signal which is applied over thirty-two corresponding parallel bit lines 54 to a shift input of a "one-hot" ring barrel shifter matrix 56, and to a shift input of a "one-hot" overflow barrel shifter matrix 62. The one-hot word length signal has a high value (high logic level voltage) only on the bit line whose position (number) corresponds to the length of the present code word being decoded. For example, a code word having a length of six bits would produce a high value ("1") on the sixth one of the bit lines 54, and a low value ("0") on the remaining ones of the bit lines 54. The name "one-hot" is derived from this fact.

The one-hot ring barrel shifter matrix 56 and the "one-hot" overflow barrel shifter matrix 62 function together as an "adder" of two one-hot numbers, i.e., the one-hot word pointer applied over the thirty-two parallel bit lines 38 and the one-hot word length applied over the thirty-two parallel bit lines 54. The "one-hot sum" of these two one-hot values is an updated one-hot word pointer which is stored in a one-hot word pointer register 58 via the parallel bit lines 57, for use in shifting the decoding window 40 in the next clock cycle. Due to its one-hot architecture, the ring barrel shifter matrix 56 has only one gate delay from any input to output. The contents of the one-hot word pointer register 58 are output over the lines 38 in the next clock cycle. Hence, the value of the one-hot word pointer applied over the lines 38 is increased by the length of the decoded code word represented by the one-hot word length signal applied over the lines 54.

The one-hot word pointer then shifts the decoding window 40 across the sequence of sixty-four available input bits to the beginning of the next code word to be decoded. The maximum value of the updated one-hot word pointer applied over the lines 57 to the data input of the one-hot word pointer register 58 is thirty-one. Assuming that bit positions are counted from zero to thirty-one, when the value of the one-hot word pointer would otherwise exceed thirty-one, an overflow is detected by the one-hot overflow barrel shifter matrix 62. When this occurs, the one-hot overflow barrel shifter matrix 62 generates the data request signal 64, which triggers a data reload operation as described hereinabove, i.e., the contents of the first register 22 are transferred to the second register 26, and a new sequence of bits from the input bit stream 20 is loaded into the first register 22. The resulting value of the one-hot word pointer, after the overflow is applied over the lines 38, is the difference between thirty-two and the larger sum that would be generated if there were no size limitations on the summing operation. For example, assume that the one-hot word pointer has a value of thirty. If the length of the next decoded code word is eight, the overflow will be triggered, and the resulting sum to be stored in the one-hot word pointer register 58 (i.e., the updated value of the one-hot word pointer) will be six.

Figure 2:
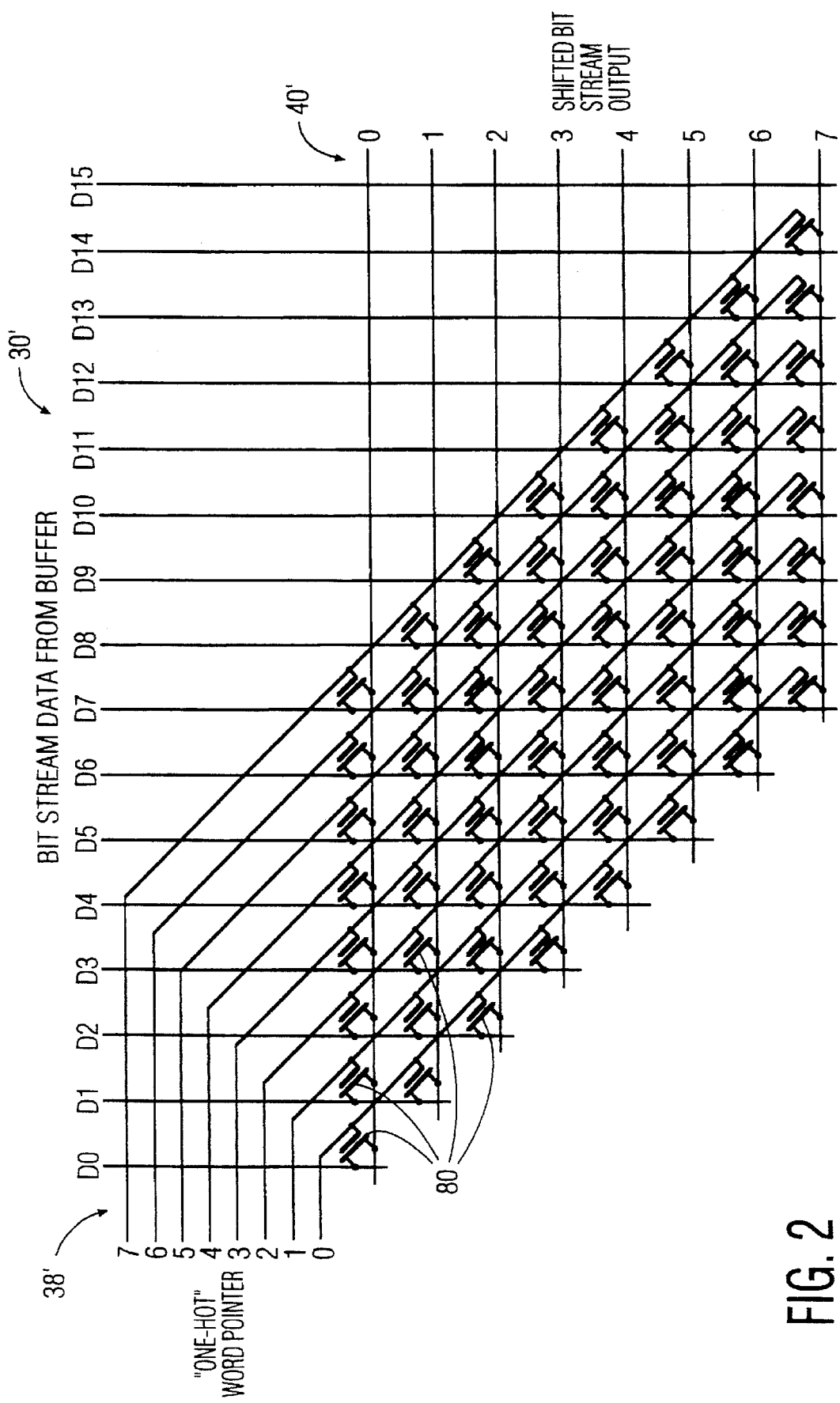
FIG. 2 is a schematic diagram of a "one-hot" bit stream barrel shifter matrix constructed in accordance with the teachings of the present invention.

FIG. 2 is diagram of a one-hot bit stream barrel shifter matrix 30' constructed in accordance with an illustrative embodiment of the present invention. The one-hot bit stream barrel shifter matrix 30' is illustrated as an eight-bit implementation for ease of discussion, and of course is not limiting to the present invention. In the illustrative embodiment depicted in FIG. 2, the one-hot bit stream barrel shifter matrix 30' is comprised of a matrix of sixty-four ($8^2$) NMOS transistors 80. However, as will be readily appreciated by those skilled in the art, any other type of gate other than a transistor may be employed to implement the matrix, e.g., a tri-state buffers could be used rather than transistors. In this connection, the transistors 80 will hereinafter be referred to generically as gates 80. Each of the gates 80 has a control terminal (e.g., the gate electrode of an NMOS transistor), an input terminal (e.g., the drain electrode of an NMOS transistor), and an output terminal (e.g., the source electrode of an NMOS transistor). The decoding window 40' includes eight parallel output bit lines numbered 0-7, each of which is connected to the output terminals of the eight gates of a respective row of gates 80. The one-hot word pointer bit lines 38' numbered 0-7 are each connected to the control terminals of the eight gates of a respective column of gates 80. The sixteen parallel input bit lines D0–D15 are each connected to the input terminals of the gates 80 connected between respective ones of the word pointer bit lines 38' and the parallel output bit lines 40'.

An eight-bit one-hot word pointer applied over the bit lines 38' selects the appropriate shift of the decoding window 40'. In this connection, when the control terminal of a given one of the gates 80 is connected to the one of the bit lines 38' which has a logic high level ("1"), and an intersecting one of the parallel input bit lines D0–D15 which has a logic high level ("1"), that given one of the gates 80 is enabled (if a transistor, turned on), and a corresponding one of the parallel output bit lines 40' connected to the output terminal thereof is thereby driven to the logic high level ("1").

Each subsequent bit line of the one-hot word pointer parallel bit lines 38' connects a subsequent sequence of the parallel input bit lines (D0–D15) to the output decoding window 40' via corresponding enabled gates. For example, a high logic level of the fifth bit line of the one-hot word pointer parallel bit lines 38' will connect the fifth through twelfth parallel input bit lines D5–D12 to the bit lines 0–7 of the output decoding window 40'.

Table 1 illustrates the operation of the one-hot bit stream barrel shifter matrix 30' described above. As can be seen in Table 1, the (i)th bit of a sequence of bits in a code word is represented by D(i) where the integer (i) varies from zero to (x). In Table 1, x=14.

TABLE 1

| "ONE-HOT" WORD POINTER | | | | | | | | "ONE-HOT" BIT STREAM BARREL SHIFTER MATRIX OUTPUT | | | | | | | |
|---|---|---|---|---|---|---|---|---|---|---|---|---|---|---|---|
| 0 | 1 | 2 | 3 | 4 | 5 | 6 | 7 | 0 | 1 | 2 | 3 | 4 | 5 | 6 | 7 |
| 1 | 0 | 0 | 0 | 0 | 0 | 0 | 0 | D0 | D1 | D2 | D3 | D4 | D5 | D6 | D7 |
| 0 | 1 | 0 | 0 | 0 | 0 | 0 | 0 | D1 | D2 | D3 | D4 | D5 | D6 | D7 | D8 |
| 0 | 0 | 1 | 0 | 0 | 0 | 0 | 0 | D2 | D3 | D4 | D5 | D6 | D7 | D8 | D9 |
| 0 | 0 | 0 | 1 | 0 | 0 | 0 | 0 | D3 | D4 | D5 | D6 | D7 | D8 | D9 | D10 |
| 0 | 0 | 0 | 0 | 1 | 0 | 0 | 0 | D4 | D5 | D6 | D7 | D8 | D9 | D10 | D11 |
| 0 | 0 | 0 | 0 | 0 | 1 | 0 | 0 | D5 | D6 | D7 | D8 | D9 | D10 | D11 | D12 |
| 0 | 0 | 0 | 0 | 0 | 0 | 1 | 0 | D6 | D7 | D8 | D9 | D10 | D11 | D12 | D13 |
| 0 | 0 | 0 | 0 | 0 | 0 | 0 | 1 | D7 | D8 | D9 | D10 | D11 | D12 | D13 | D14 |

Figure 3:
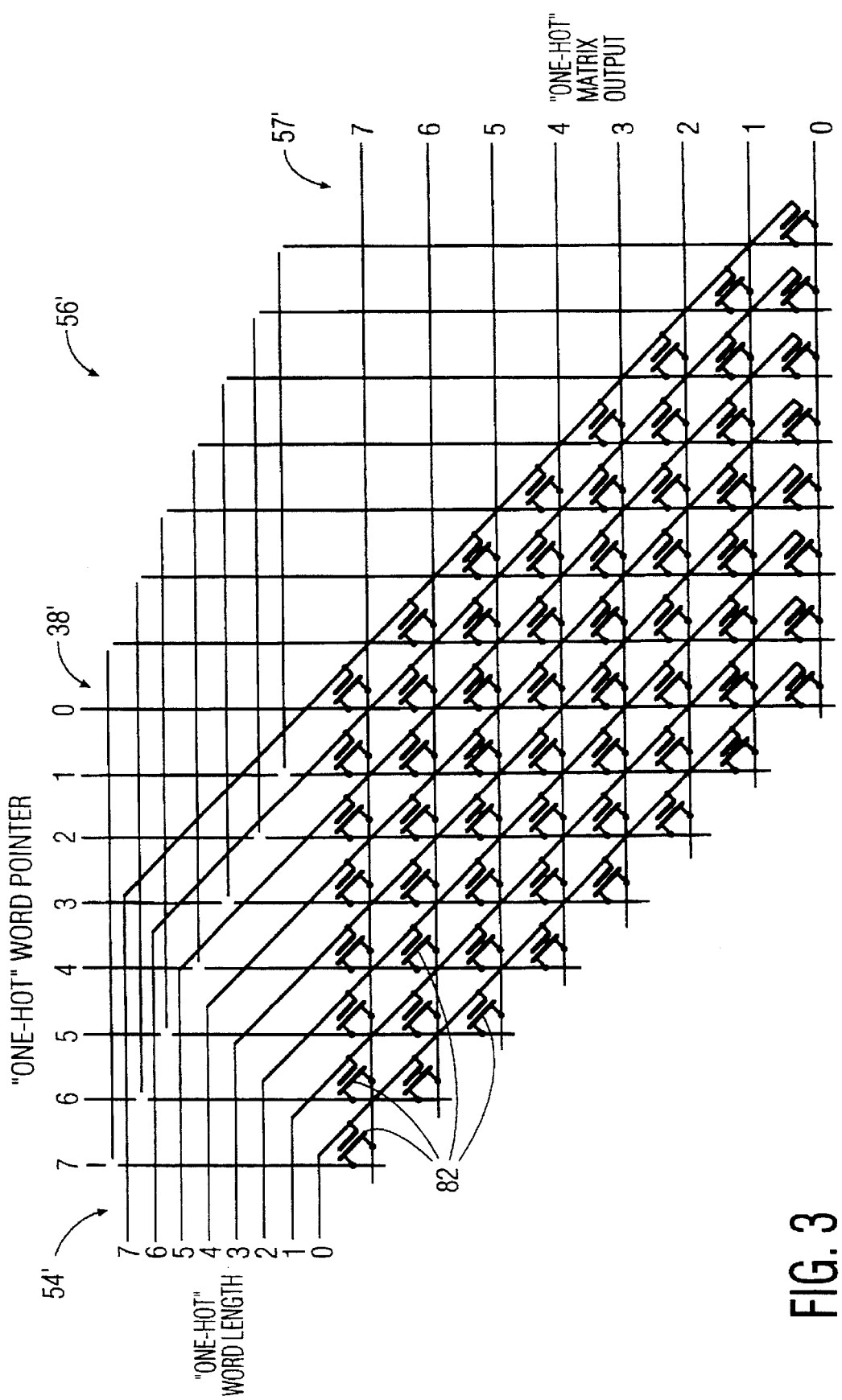
FIG. 3 is a schematic diagram of a "one-hot" ring barrel shifter matrix constructed in accordance with the teachings of the present invention; and, FIG. 4 is a schematic diagram of a "one-hot" overflow barrel shifter matrix constructed in accordance with the teachings of the present invention.

FIG. 3 is a diagram of a one-hot ring barrel shifter matrix 56' constructed in accordance with an illustrative embodiment of the present invention, using an 8-bit implementation (rather than the preferred 32-bit implementation) for illustrative purposes only. The one-hot ring barrel shifter matrix 56' performs an eight bit shift of the parallel output bit lines 57'. If the data applied over the data input lines 38' of the one-hot ring barrel shifter matrix 56' are represented in one-hot code, and the data applied over the lines 54' are represented in one-hot code, the result of such shift operation is a one-hot value at the output 57' which is equal to the arithmetic sum of the one-hot values on the lines 54' and 38'.

Figure 4:
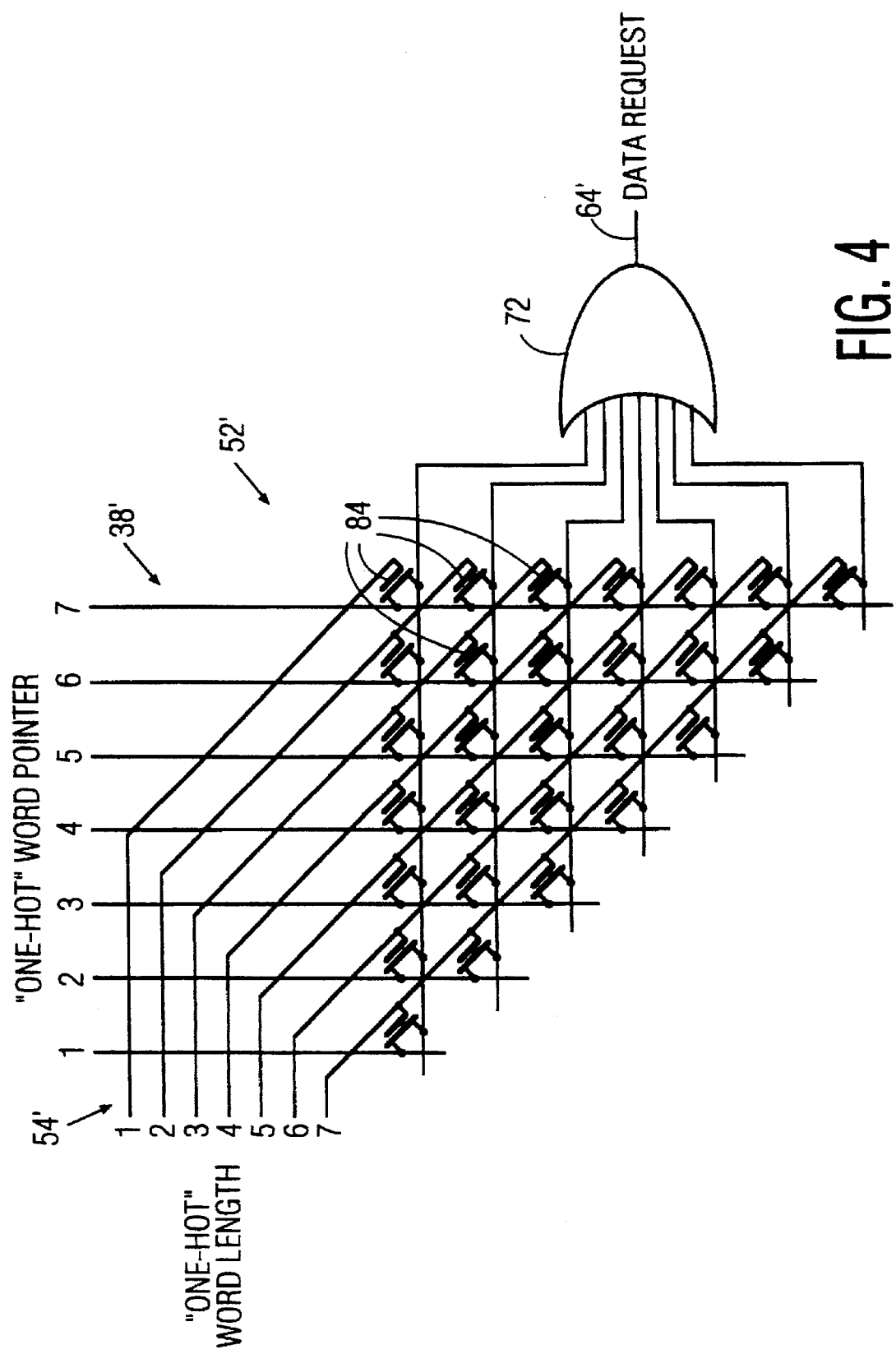

The one-hot ring barrel shifter matrix 56', in combination with the one-hot overflow barrel shifter matrix 62' depicted in FIG. 4, "adds" a one-hot word length 54' to a one-hot word pointer applied over the parallel bit lines 38'. If the addition of these two one-hot numbers is eight or larger, the resulting sum from the one-hot ring barrel shifter matrix 56' is the difference between eight, and the sum that is eight or larger. For example, five plus five results in a sum of two at an output bit line 57' of the one-hot ring barrel shifter matrix 56'. The sum of one plus seven is zero as performed by the one-hot ring barrel shifter matrix 56'. Every time the result is more than seven, the one-hot overflow barrel shifter matrix 62' generates a signal indicating this condition.

All input and output bit lines are labeled starting from zero rather than one so that addition will work properly. Each bit line of the one-hot word pointer bit lines 38' is connected to a respective one of the parallel output bit lines 57' via a respective one of the gates 82 which is controlled by a respective one of the one-hot word length bit lines 54'. Each bit line of the one-hot word pointer bit lines 38' is connected to each of the output bit lines 57' via respective ones of the gates 82, the control terminals of which are controlled by respective ones of the one-hot word length bit lines 54'.

Specifically, the bit (i) of the one-hot word pointer bit lines 38' is connected to the bit lines 0 through 7 of the output bit lines 57' via respective ones of the gates 82 controlled by the bit lines 0 through 7 of the one-hot word length bit lines 54'. In operation, a high logic level ("1") of bit line (i) of the one-hot word length bit lines 54' turns on all of the gates connecting each bit line of the output bit lines 57' to appropriate ones of the one-hot word pointer bit lines 38'. For example, a high logic level of the bit line 4 of the one-hot word length bit lines 54' turns on all of the gates 82 connecting bit line 7 through bit line 0 of the output bit lines 57' to the bit lines 3, 2, 1, 0, 7, 6, 5, and 4 of the one-hot word pointer bit lines 38'.

In the above example, if the bit line 2 of the one-hot word pointer bit lines 38' has a high logic level, the high logic level on the bit line 2 will be transferred to the bit line 6 of the output bit lines 57'. Hence, the position of bit 4 of the one-hot word length value applied over the bit lines 54' was added to the position of the bit line 4 of the one-hot word pointer applied over the bit lines 38' and output as a high logic level of the bit line 6 of the output bit lines 57'. As another example, if the bit line 7 of the one-hot word length bit lines 54' is high, and the bit line 7 of the one-hot word pointer bit lines 38' is high, then the bit line 6 of the output bit lines 57' will be driven to the high logic level. Since seven added to seven is fourteen, and fourteen minus eight is six, the high value on the bit line 6 of the output bit lines 57' is correct. Simultaneously, an overflow bit is generated by the one-hot overflow barrel shifter matrix 62' of FIG. 4.

FIG. 4 is a diagram of an overflow barrel shifter matrix 62' constructed in accordance with an illustrative embodiment of the present invention. The bit lines 1 through 7 of the one-hot word length lines 54' control gates connecting the bit lines 1 through 7 of the one-hot word pointer bit lines 38' to respective inputs of an OR gate 72. The output of the OR gate 72 is the data request line 64'. When the data request line 64' transitions to a high logic level, new data is loaded into the variable length decoder (shown as 10 in FIG. 1). If the sum of the positions of the high bit lines of the one-hot word length bit lines 54' and the one-hot word pointer bit lines 38' is eight or larger, a high value will appear at the respective input of the OR gate 72. A high value at any input of the OR gate 72 produces a high value at the output of the OR gate 72, and hence, the data request line 64' is activated. With the above example of the one-hot addition of two numbers seven and seven, the lowest gate connected between the bit line 7 of the one-hot word pointer lines 38' and the bit line 7 of the one-hot word length lines 54' will be activated, thereby producing a logic "1" at the respective input of the OR gate 72.

Table 2 illustrates the operation of the one-hot ring barrel shifter matrix 56' and the one-hot overflow barrel shifter matrix 62' described above. Each bit of the one-hot word pointer applied over the bit lines 38', the one-hot word length bit lines 54', and the matrix output bit lines 57' are numbered according to the heading from bit 7 to bit 0.

TABLE 2

| "ONE-HOT" WORD POINTER | | | | | | | | "ONE-HOT" WORD LENGTH | | | | | | | | "ONE-HOT" RING MATRIX OUTPUT | | | | | | | | DATA REQUEST OVERFLOW |
|---|---|---|---|---|---|---|---|---|---|---|---|---|---|---|---|---|---|---|---|---|---|---|---|---|
| 7 | 6 | 5 | 4 | 3 | 2 | 1 | 0 | 7 | 6 | 5 | 4 | 3 | 2 | 1 | 0 | 7 | 6 | 5 | 4 | 3 | 2 | 1 | 0 | |
| 0 | 0 | 0 | 1 | 0 | 0 | 0 | 0 | 0 | 0 | 0 | 0 | 0 | 0 | 0 | 1 | 0 | 0 | 0 | 1 | 0 | 0 | 0 | 0 | 0 |
| 0 | 0 | 0 | 1 | 0 | 0 | 0 | 0 | 0 | 0 | 0 | 0 | 0 | 0 | 1 | 0 | 0 | 0 | 1 | 0 | 0 | 0 | 0 | 0 | 0 |
| 0 | 0 | 0 | 1 | 0 | 0 | 0 | 0 | 0 | 0 | 0 | 0 | 0 | 1 | 0 | 0 | 0 | 1 | 0 | 0 | 0 | 0 | 0 | 0 | 0 |
| 0 | 0 | 0 | 1 | 0 | 0 | 0 | 0 | 0 | 0 | 0 | 0 | 1 | 0 | 0 | 0 | 1 | 0 | 0 | 0 | 0 | 0 | 0 | 0 | 0 |
| 0 | 0 | 0 | 1 | 0 | 0 | 0 | 0 | 0 | 0 | 0 | 1 | 0 | 0 | 0 | 0 | 0 | 0 | 0 | 0 | 0 | 0 | 0 | 1 | 1 |
| 0 | 0 | 0 | 1 | 0 | 0 | 0 | 0 | 0 | 0 | 1 | 0 | 0 | 0 | 0 | 0 | 0 | 0 | 0 | 0 | 0 | 0 | 1 | 0 | 1 |
| 0 | 0 | 0 | 1 | 0 | 0 | 0 | 0 | 0 | 1 | 0 | 0 | 0 | 0 | 0 | 0 | 0 | 0 | 0 | 0 | 0 | 1 | 0 | 0 | 1 |
| 0 | 0 | 0 | 1 | 0 | 0 | 0 | 0 | 1 | 0 | 0 | 0 | 0 | 0 | 0 | 0 | 0 | 0 | 0 | 0 | 1 | 0 | 0 | 0 | 1 |

The above table (Table 2) illustrates the addition of the one-hot word pointer fixed value four to the one-hot word length values from zero to seven. The result of this addition is reflected in the output 57' of the one-hot ring barrel shifter matrix 56' with the overflow signal generated above. Therefore, it has been illustrated that if two numbers at the data input and the shift input of the one-hot ring barrel shifter matrix 56' are represented in one-hot code, then the value of the output 57' will represent their one-hot sum with the overflow generated as necessary by the one-hot overflow barrel shifter matrix 62'. Therefore, it can be understood that the much slower adder (having layers of logic gates) used in the conventional variable length decoders (such as the one disclosed in the hereinabove-referenced Sun et al. patent) is replaced by the much faster one-hot addition circuit comprised of the one-hot ring barrel shifter matrix 56' and the one-hot overflow barrel shifter matrix 62'.

The one-hot architecture of the word length computation loop of the variable length decoder of the present invention significantly reduces the propagation delay through the word length computation loop relative to the word length computation loop used in the conventional variable length decoders, such as the one disclosed in the above-referenced Sun et al. patent, and thereby greatly accelerates the word length computation loop, thus facilitating greater throughput.

Further, by replacing the relatively slow adder-accumulator circuit of the conventional variable length decoders with the disclosed one-hot adder-accumulator circuit, a one-hot word pointer is produced that will not require additional decoding at the shift input of the one-hot bit stream barrel shifter matrix.

Additionally, the one-hot operation of the one-hot word length decoder is accelerated due to the elimination of the logic required in the conventional word length decoder to produce a 5-bit encoded length value, as opposed to a 32-bit (for example) one-hot word length value, which can be viewed as a "one-out-of-N" data representation. In this regard, the one-hot word length computation loop of the present invention eliminates the layers of logic gates required in the conventional word length computation loop, which includes a wide-barrel shifter, a conventional word length decoder, and an adder-accumulator.

With the one-hot architecture of the word length computation loop of a preferred embodiment of the present invention, the wide-barrel shifter is replaced by a "one-hot" bit stream barrel shifter matrix, the conventional word length decoder is replaced by a "one-hot" word length decoder, and the adder-accumulator is replaced by a "one-hot" ring barrel shifter matrix and "one-hot" overflow barrel shifter matrix. Alternatively, significant acceleration of the word length computation loop can be achieved even if conventional barrel shifters are used instead of the "one-hot" barrel shifter matrices.

Regardless of the implementation, the critical path of a barrel shifter is between its shift input (normally 5 bits for MPEG-2) and the output. With the barrel shifters used in conventional variable length decoders, shift input has to be internally decoded. Each of the barrel shifter outputs is derived as a logical OR of the outputs of 32 logic AND gates, where each of these 32 AND gates has a different data input and a decoded shift input. Decoding the shift input code requires a few extra gate delays for its implementation in silicon. Using the one-hot architecture for the bit stream barrel shifter eliminates these delays. Furthermore, the barrel shifter itself can be implemented as a true matrix with only one gate delay.

The 5-bit adder used in the conventional variable length decoders is normally implemented using several layers of logic gates. Replacing the 5-bit adder with the one-hot ring barrel shifter matrix in combination with the one-hot overflow barrel shifter matrix reduces the propagation delay to a single gate delay if they are implemented as true matrices.

The word length decoder used in the conventional variable length decoders include a complex, multiplexed look-up table where some arithmetic operations are also possible. Replacing the conventional word length decoder with the one-hot word length decoder greatly reduces the amount of required logic, and therefore, significantly lowers propagation delays.

The matrix barrel shifter implementation throughout this one-hot architecture provides a very high speed of operation. The fact that the shift input is fully decoded (one-hot) allows it to be applied directly to the matrices without using decoding circuits included in the barrel shifters used in conventional variable length decoders. The propagation delay through all barrel shifter matrices is therefore equal to a single gate delay. Overall, a very significant speed improvement is achieved as by the combination of these individual gains. It should be clearly understood that the one-hot architecture is not limited to that of the illustrative embodiment of the variable length decoder of the present invention described hereinabove. Rather, the one-hot architecture disclosed herein can be advantageously employed in a variable length decoder having virtually any configuration. For example, using the one-hot architecture of the present invention in the variable length decoder disclosed in a co-pending U.S. patent application entitled "High Performance Variable Length Decoder With Enhanced Throughput Due to Tagging of the Input Bit Stream and Parallel Processing of Contiguous Code Words", by M. Bakhmutsky, the disclosure of which is herein incorporated by reference, throughputs in excess of 200 million code words per second.

To further enhance the speed of operation of the variable length decoder of the present invention, a "one-hot" state machine well-known to those skilled in the art can be used in the control circuit 50 in place of a conventional state machine. The one-hot state machine normally runs faster than a conventional state machine, and provides the additional benefit of fully decoded word type select control signals that will accelerate the length and value decoding operations.

Although a preferred embodiment of the present invention has been described in detail hereinabove, it should be clearly understood that many variations and/or modifications of the basic inventive concepts herein taught which may appear to those skilled in the pertinent art will still fall within the spirit and scope of the present invention as defined in the appended claims.

What is claimed is:

1. A high speed variable length decoder for decoding code words contained in an input bit stream which includes a plurality of code words, comprising:

input means for receiving the input bit stream and for providing a decoding window that includes a parallel sequence of bits which includes one or more code words to be decoded at an output thereof;

word length decoder means connected to said decoding window and providing a numbered first sequence of output bit lines, each numbered line in said sequence having a first voltage state except one of said numbered lines whose number in said sequence of output bit lines corresponds to the length of a code word(s) in said decoding window, whereby the length of said code word(s) is represented by a one-hot word length signal;

shifting means for generating a one-hot word pointer for shifting said decoding window across a parallel sequence of available input bits to a next code word to be decoded, said shifting means having a first input coupled to said one-hot word pointer and a second input coupled to said one-hot word length signal; and, value decoding means for determining the values of said code words to be decoded and for providing said decoded values at an output of said variable length decoder.

2. The variable length decoder as set forth in claim 1, wherein said input means includes a one-hot bit stream barrel shifter matrix for providing said input decoding window.

3. The variable length decoder as set forth in claim 1, wherein said input means comprises:

a first register for receiving said input bit stream, and for outputting a first parallel sequence of input bits;

a second register coupled to an output of said first register, and for outputting a second parallel sequence of input bits;

a one-hot bit stream barrel shifter matrix having an input coupled to said first and second parallel sequences of input bits to thereby provide said parallel sequence of available input bits, the number of said available input bits being equal in number to the total of said first and second parallel sequences of input bits, and for providing said decoding window at an output thereof; and, wherein said decoding window is shifted in response to said one-hot word pointer across said parallel sequence of available input bits.

4. The variable length decoder as set forth in claim 3, further comprising a one-hot overflow barrel shifter matrix having a first input connected to said one-hot word pointer, and a second input connected to said one-hot word length signal, wherein a new sequence of bits from said input bit stream is loaded into said first register and the contents of said first register are transferred into said second register in response to an overflow signal generated by said one-hot overflow barrel shifter matrix.

5. The variable length decoder as set forth in claim 3, wherein the bit width of said decoding window is at least equal to the bit length of the maximum length code word in said input bit stream.

6. The variable length decoder as set forth in claim 3, wherein the bit width of said parallel sequence of available input bits is greater than the bit width of said decoding window.

7. The variable length decoder as set forth in claim 3, wherein the bit width of said parallel sequence of available input bits is sixty-four bits, and the bit width of said decoding window is thirty-two bits.

8. The variable length decoder as set forth in claim 3, wherein said input bit stream is a digital video data stream.

9. The variable length decoder as set forth in claim 3, wherein said digital video data stream is an MPEG data stream.

10. The variable length decoder as set forth in claim 1, wherein said shifting means includes a one-hot ring barrel shifter matrix for adding said one-hot word length signal to said one-hot word pointer to produce a sum which constitutes an updated one-hot word pointer for use in a next clock cycle.

11. The variable length decoder as set forth in claim 10, wherein said shifting means further includes a one-hot word pointer register for storing said updated one-hot word pointer until said next clock cycle.

12. The variable length decoder as set forth in claim 10, wherein said shifting means further includes a one-hot overflow barrel shifter matrix having a first input connected to said one-hot word pointer and a second input connected to said one-hot word length signal, for generating an overflow signal for requesting a new sequence of bits from said input bit stream to be loaded into said input means in the event of overflow of said one-hot ring barrel shifter matrix.

13. The variable length decoder as set forth in claim 1, wherein said word length decoder means includes a one-hot word length decoder with a look-up table.

14. The variable length decoder as set forth in claim 1, further comprising a control means for controlling the operation of the variable length decoder in accordance with a prescribed decoding protocol, on the basis of current and previously decoded code words.

15. The variable length decoder as set forth in claim 14, wherein said control means includes a state machine and associated logic circuitry for controlling the operation of the variable length decoder.

16. A method for decoding variable length code words contained in an input bit stream, comprising:

receiving a sequence of available input bits from the input bit stream and outputting a parallel sequence of bits which define a decoding window;

using a one-hot word length decoder to produce a one-hot word length signal including a plurality of bits, only one of which at a high logic level at any given time;

shifting said decoding window in response to said one-hot word length signal across a sequence of available input bits to the beginning of a next code word to be decoded; and, determining the values of said code words to be decoded providing said values at the output of said variable length decoder.

17. A high speed variable length decoder for decoding code words contained in an input bit stream which includes a plurality of code words, comprising:

an input circuit for receiving the input bit stream and for providing a decoding window that includes a parallel sequence of bits which includes one or more code words to be decoded at an output thereof;

a one-hot word length decoder connected to said decoding window for generating a one-hot word length signal indicative of the length of a code word(s) in said decoding window;

a shift circuit for generating a one-hot word pointer for shifting said decoding window across a parallel sequence of available input bits to a next code word to be decoded, said shift circuit having a first input coupled to said one-hot word pointer, and a second input coupled to said one-hot word length signal; and, a code word value decoder circuit for determining the values of said code words to be decoded and for providing said decoded values at an output of said variable length decoder.

18. The variable length decoder as set forth in claim 17, wherein said input circuit includes a one-hot bit stream barrel shifter matrix for providing said input decoding window.

19. The variable length decoder as set forth in claim 17, wherein said input circuit comprises:

a first register for receiving said input bit stream, and for outputting a first parallel sequence of input bits;

a second register coupled to an output of said first register, and for outputting a second parallel sequence of input bits;

a one-hot bit stream barrel shifter matrix having an input coupled to said first and second parallel sequences of input bits to thereby provide said parallel sequence of available input bits, the number of said available input bits being equal in number to the total of said first and second parallel sequences of input bits, and for providing said decoding window at an output thereof; and, wherein said decoding window is shifted in response to said one-hot word pointer across said parallel sequence of available input bits.

* * * * *